United States Patent [19]

Czarniak et al.

[11] Patent Number: 4,746,903

[45] Date of Patent: May 24, 1988

[54] PARALLEL ALGORITHMIC DIGITAL TO ANALOG CONVERTER

[75] Inventors: Jean-Christophe Czarniak, Saint Paul; Michel F. Ferry, Vallauris; Christian Jacquart, Gattieres, all of France

[73] Assignee: International Business Machines Corporation, Armonk, N.Y.

[21] Appl. No.: 942,745

[22] Filed: Dec. 17, 1986

[30] Foreign Application Priority Data

Dec. 30, 1985 [EP] European Pat. Off. ........ 85430046.4

[51] Int. Cl.[4] ............................................. H03M 1/66
[52] U.S. Cl. ................................................. 340/347 DA
[58] Field of Search ................................. 340/347 DA

[56] References Cited

U.S. PATENT DOCUMENTS 3,251,052 5/1966 Hoffman ...................... 340/347 DA
3,273,142 9/1966 Zukin ............................ 340/347 DA

OTHER PUBLICATIONS

Hnatek, "A User's Handbook of D/A and A/D Converters" ©1976, pp. 100-102.
P. W. Li et al., 1984 *IEEE International Solid-State Circuits Conference*, vol. 27, pp. 62, 63, 318, Feb. 22, 1984, "A Ratio-Independent Algorithmic A/D Conversion Technique".

*Primary Examiner*—Charles D. Miller
*Attorney, Agent, or Firm*—Stephen J. Limanek

[57] ABSTRACT

A digital to analog converter for converting an N-bit digital word into its analog representation including means for splitting the N bits into n sections of N/n bits each. For instance a 12-bit word is split into an odd section and an even section which are processed independently and in parallel. This results in two partial results, $V_i$ and $V_p$, respectively, representative of the odd and even bit sections. The last step of the conversion is the action of the two partial results $V_i$ and $V_p$ to provide the analog representation of the 12-bit word. Few operators are required to process each section because each bit is converted sequentially. This provides a low cost, compact and simple converter, moreover, since few operators are required, it may be advantageous to use high precision operators as disclosed.

4 Claims, 8 Drawing Sheets

Conversion algorithm of n bits+sign digital word $$V_{out} = \frac{Sign \times V_{ref}}{2^{n-1}} \times (b_{n-1} \times 2^{n-1} + b_{n-2} \times 2^{n-2} + \ldots + b_0 \times 2^0)$$

FIG 5.a  PHASE 1

FIG 5.b  PHASE 2

FIG 5.c  PHASE 3

FIG 5.d  PHASE 4

Vout = 2 x Vin

FIG. 5

FIG 6.a  PHASE 1

FIG 6.b  PHASE 2

FIG 6.c  PHASE 3

FIG 6.d  PHASE 4

FIG. 6

FIG 7.a PHASE 1

FIG 7.b PHASE 2

FIG. 7

PARALLEL ALGORITHMIC DIGITAL TO ANALOG CONVERTER

DESCRIPTION

1. Technical Field

The invention relates to a digital-to-analog converter for converting N-bit digital words into their analog representations.

2. Background Art

Conventional digital-to-analogic converters (DAC) include a binary-weighted resistor network (e.g., the commonly used R, 2R ladder network), switches, a reference current or voltage source and a summing device. The resistor network produces binary-weighted currents or voltages that can be switched to ON or OFF in accordance with the digital input word. Those binary-weighted currents or voltages drive the summing device which provides, at least, the analog representation of the digital input word. That kind of converter needs a complex circuitry which takes up a substantial amount of space. In addition, to reach a high degree of precision, the network must include a large number of precise resistors; the absolute accuracy of the resistors in the R, 2R ladder is not critical, but their ratio is; that large number of precise components will increase the cost of the DAC. Moreover, since precise resistors, or adjustable resistors are difficult to be placed into a chip, those conventional converters are not suitable to be used into full integrated structures.

Another kind of DAC, based on an algorithmic process, considers one bit at a time in the conversion processing. This reduces the complexity of the circuit, and the number of precise components necessary. However, the number of steps of a conversion cycle tends to slow the analogizing operation, increases the conversion time and, thus, decreases the overall efficiency of the analog conversion process.

3. Disclosure of the Invention

Accordingly, it is an object of this invention to provide a relatively simple and compact DAC, which operates in a multiplexing way and thus reduces the number of components and elementary operators. The invention may be carried out by using only two operators, a divide by 4 circuit and a multiply by 2 circuit.

Another object of the invention is to provide a low cost converter since the multiplexing process reduces the number of precise and expensive components.

A further object of the invention is to provide a converter easy to integrate into full integrated circuits, since the number of precise or adjustable components is considerably reduced and therefore less difficult to locate in chips.

Another object of the invention is to provide an efficient DAC, with a short conversion time. This results from its characteristic of splitting the N bits into sections, which permits reducing considerably the number of steps of a conversion cycle and allows a quick conversion process. In conclusion, the invention permits combining high efficiency (a short time conversion) with a simple and compact circuit. These and other objects of the invention will become apparent from the following description of embodiments of the invention.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
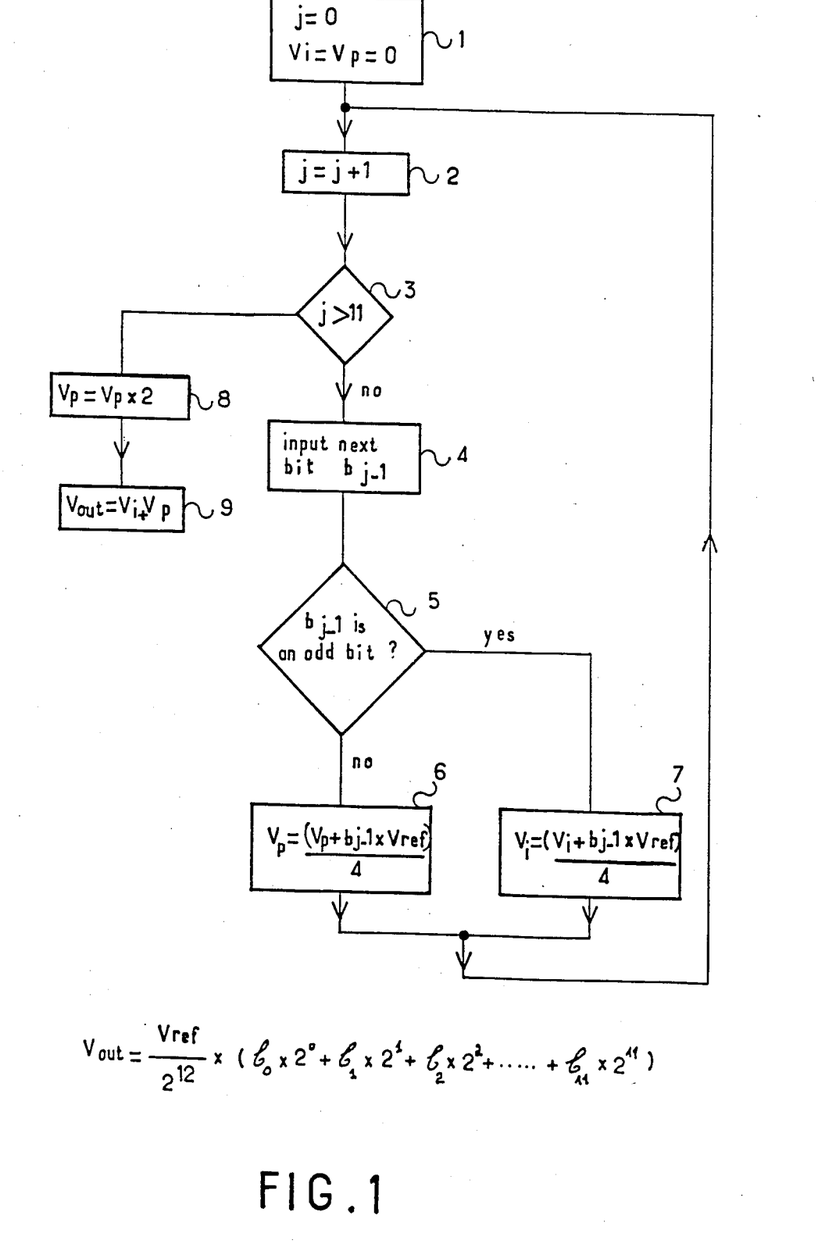
FIG. 1 is a flow chart illustrating the basic concept of the present invention.

FIG. 1 is a chart illustrating the basic concept of the invention. Let us call N the number of bits of a digital word; in the following, assume that N=12. The 12 bits of a digital word are split into two sections, odd bits and even bits. For instance in the following word:

$$b_{11}-b_{10}-b_9-\ldots-b_1-b_0,$$

$b_{10}, b_8, b_6, \ldots, b_0$ are called even bits and the others are called odd bits.

Let us define other variables;

j: integer used as a counter $V_p$: voltage which is the analog representation of even bits $V_{out}$: output voltage $V_i$: voltage representative of odd bits $V_{ref}$: reference voltage.

The algorithm begins by initiating variables i and p, step 1, $j=0$ $V_i=0$ $V_p=0$.

The least significant bit (LSB) is decided first; the variable j is incremented, step 2. Then the value of j is tested to determine whether each bit has been converted, step 3. If not, the bit $b_{j-1}$ is inserted, step 4. Then the character of that bit $b_{j-1}$ is tested, step 5. If $b_{j-1}$ is an "even" bit, the process goes on with step 6 in which the operation $V_p=(V_p+b_{j-1}\times V_{ref})/4$ is processed; otherwise it is the operation $V_i=(V_i+b_{j-1}\times V_{ref})/4$ which is processed, step 7. Then the process goes back to step 2 to increment again the variable j.

When the last bit $b_{11}$ has been converted (i.e., j=12), the process goes to step 8 to process a multiplication by 2 affecting the value of $V_p$ and then step 9 provides the analog representation $V_{out}=V_i+V_p$ of the digital word. The advantages offered by such a way of processing includes the low number of operators necessary to provide the analog representation of the digital word, in our example: a divide by 4 operator, a multiply by 2 operator (which can be easily replaced by an adder operator) and an adder operator.

That will result in an ease in designing the converter and the possibility to combine a high accuracy with a low cost circuit since few precise components are required.

Figure 2A:
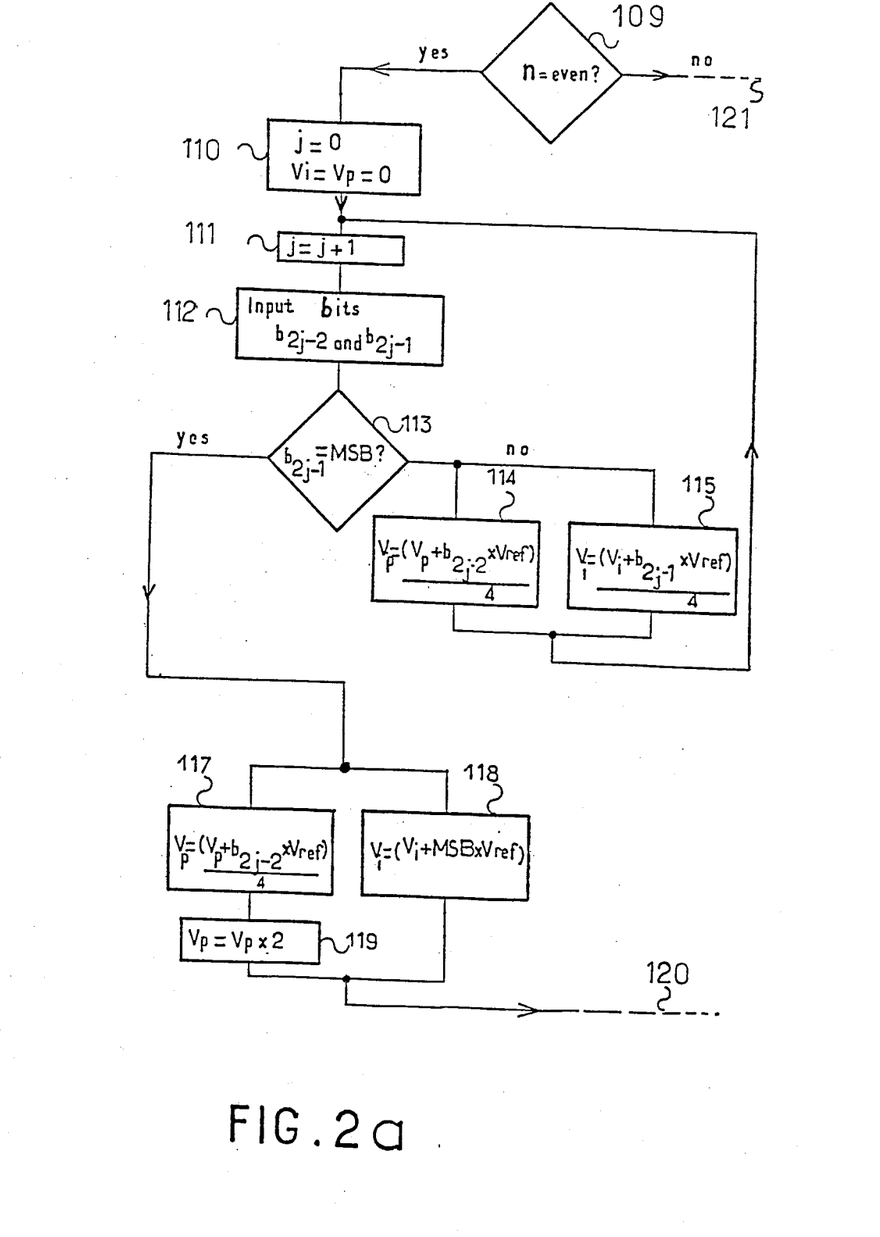
FIGS. 2a and 2b show a flow chart of a more sophisticated algorithm based on the concept of the present invention.
Figure 2B:
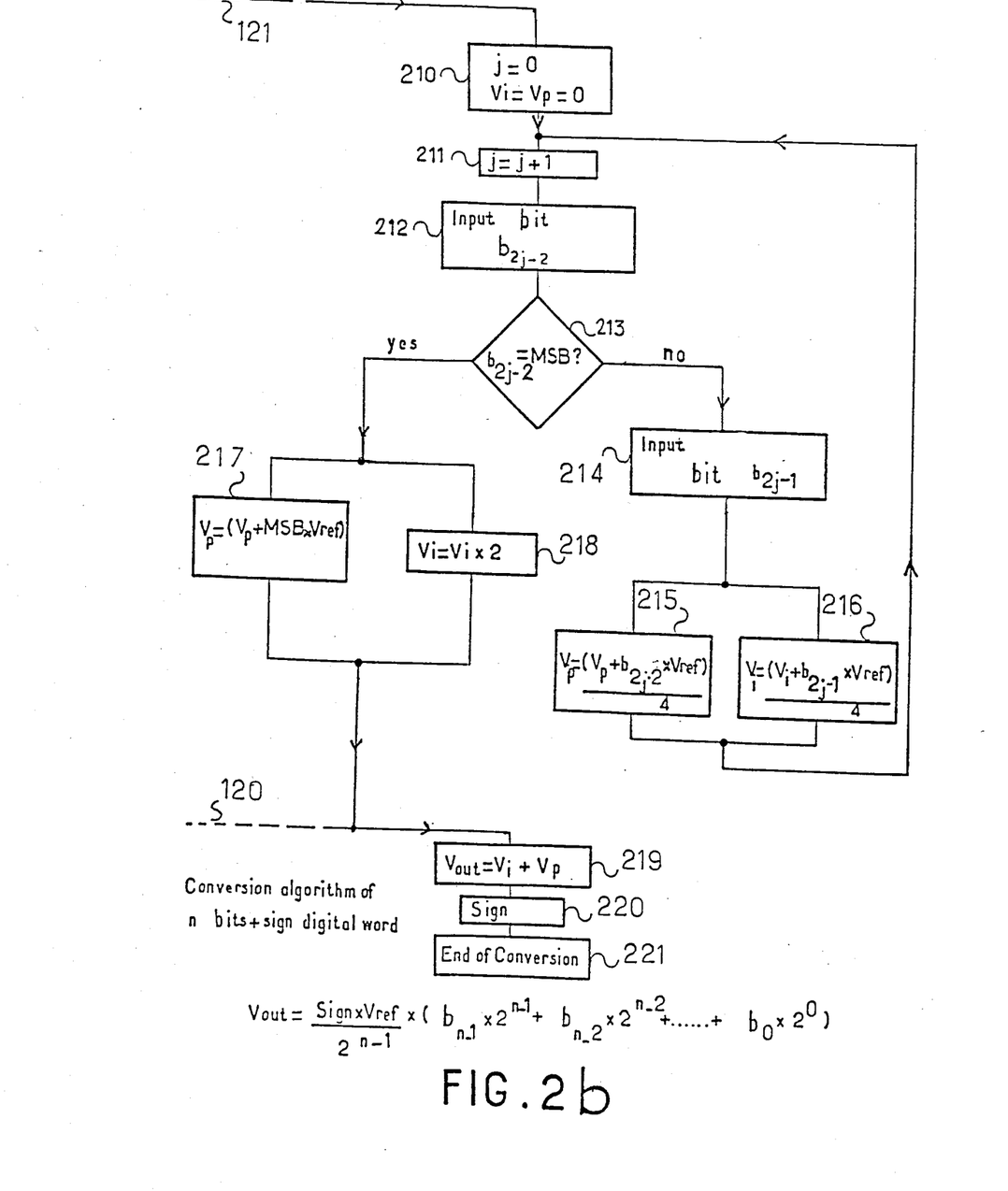

A more sophisticated algorithm based on the same concept is shown in the flow chart of FIGS. 2a and 2b. The sequence begins with step 109 which is a test of the character of the number of bits N of the digital word. If N is an even integer, the sequence progresses to step 110 which initiates variables j, $V_i$ and $V_p$. Then, in step 111, the counter j is incremented. Bits $b_{2j-1}$ and $B_{2j-2}$ to be converted are inserted, step 112. Bit $b_{2j-1}$ is tested to determine whether it is the most significant bit (MSB), step 113. If not, the process goes back to step 114 and 115 in which bits $b_{2j-2}$ and $b_{2j-1}$ are converted simultaneously. Then the process goes back to step 111 again. As soon as the last bit is inserted $b_{2j-1}$ is the MSB, the sequence progresses from step 113 to steps 117 and 118 in which the calculations $V_p=(V_p+b_{2j-2}\times V_{ref})/4$ and $V_i=(V_i+MSB\times V_{ref})$ are processed. The sequence progresses from step 117 to step 119 which is a multiplication by 2 affecting the value of $V_p$. The step following steps 118 and 119 is step 219 shown in FIG. 2b and connected by arrow 120.

If N is an odd integer, the sequence progresses from step 109 to step 210 shown in FIG. 2b; that step initiates variables j, $V_i$, $V_p$. Then in step 211, the counter j is incremented. Bit $b_{2j-2}$ is inserted, step 212; this bit is tested to determine whether it is the MSB, step 213. If not, bit $b_{2j-1}$ is inserted, step 214. Then the sequence progresses to steps 215 and 216 in which bits $b_{2j-2}$ and $b_{2j-1}$ are converted simultaneously.

Then, the process goes back to step 211 again. As soon as the last bit inserted $b_{2j-2}$ is the MSB, the sequence progresses from step 213 to steps 217 and 218 in which the calculations $V_p=(V_p+MSB\times V_{ref})$ and $V_i=V_i\times 2$ are processed.

The sequence progresses from steps 118, 119 and 217, 218 to step 219 which is an addition of $V_i$ and $V_p$ to provide $V_{out}$. Then the sign of the digital word is taken into account to provide an output voltage positive or negative. Step 221 is the end of the conversion.

As a conclusion, the main idea is to convert 2 bits at the same time, one "odd" bit and one "even" bit. This allows a minimization of the number of steps necessary for the conversion cycle and results in the reduction of the final conversion time.

Figure 3:
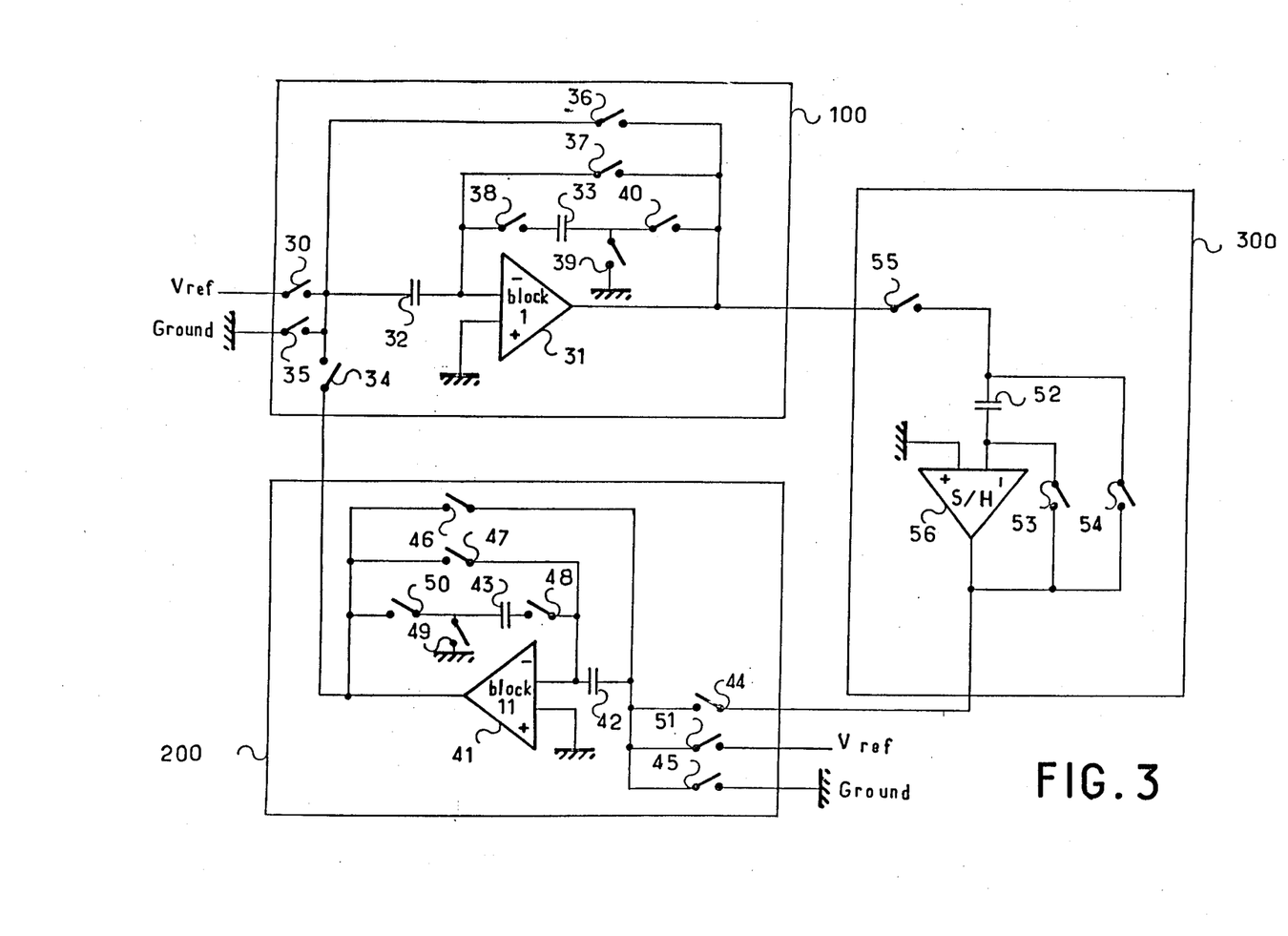
FIG. 3 illustrates a preferred embodiment of the invention corresponding to the flow chart of FIGS. 2a and 2b.
Figure 5:
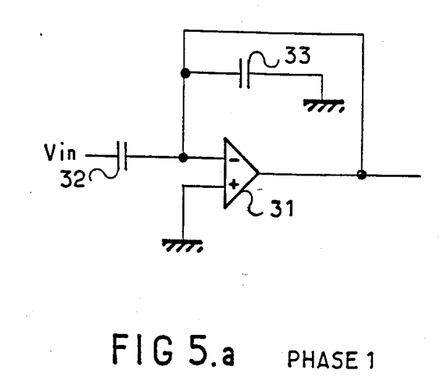
Figure 6:
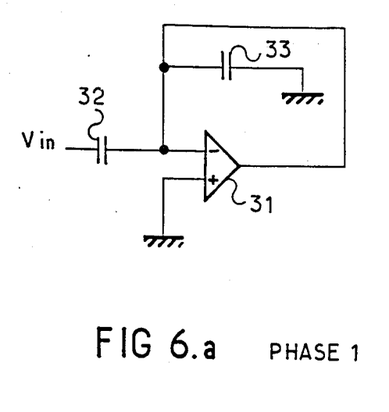
FIGS. 6a, 6b, 6c and 6d illustrate different phases for providing a division by four.

FIG. 3 illustrates a circuit of a preferred embodiment corresponding to the flow chart of FIGS. 2a and 2b. This circuit presents characteristics which include high precision operators. Indeed, since few operators are required to make up an embodiment of the invention (in FIG. 1, only a divide by 4 circuit and a multiply by 2 circuit are required), it might be sensible and interesting to use high precision operators, such as described later (FIGS. 5 and 6) which permit obtaining a simple, compact, low cost and accurate converter. Moreover, using further described exact operators allows the electronic designer to include the converter in full integrated structures since it needs no precise or adjustable components.

The schematic of FIG. 3 includes 3 blocks, each one devoted to a precise function. The first block 100 is made up of an operational amplifier (OA) 31, two capacitors 32 and 33 and switches 30, 34, 35, 36, 37, 38, 39 and 40. Block 200 is similar to block 100 and it includes an OA 41, two capacitors 42 and 43 and switches 44, 45, 46, 47, 48, 49, 50 and 51. Block 300 includes an OA 56, a capacitor 52 and switches 53, 54 and 55. Blocks 100 and 200 are used to process the following basic functions: voltage addition, precise multiplication by 2 and precise division by 4. Block 300 is a sample/hold module which tracks the analogic signal provided by the block 100 and then holds its instantaneous value while the block 100 begins the next operation. Blocks 100, 200 and 300 are more completely described hereinbelow.

Figure 4:
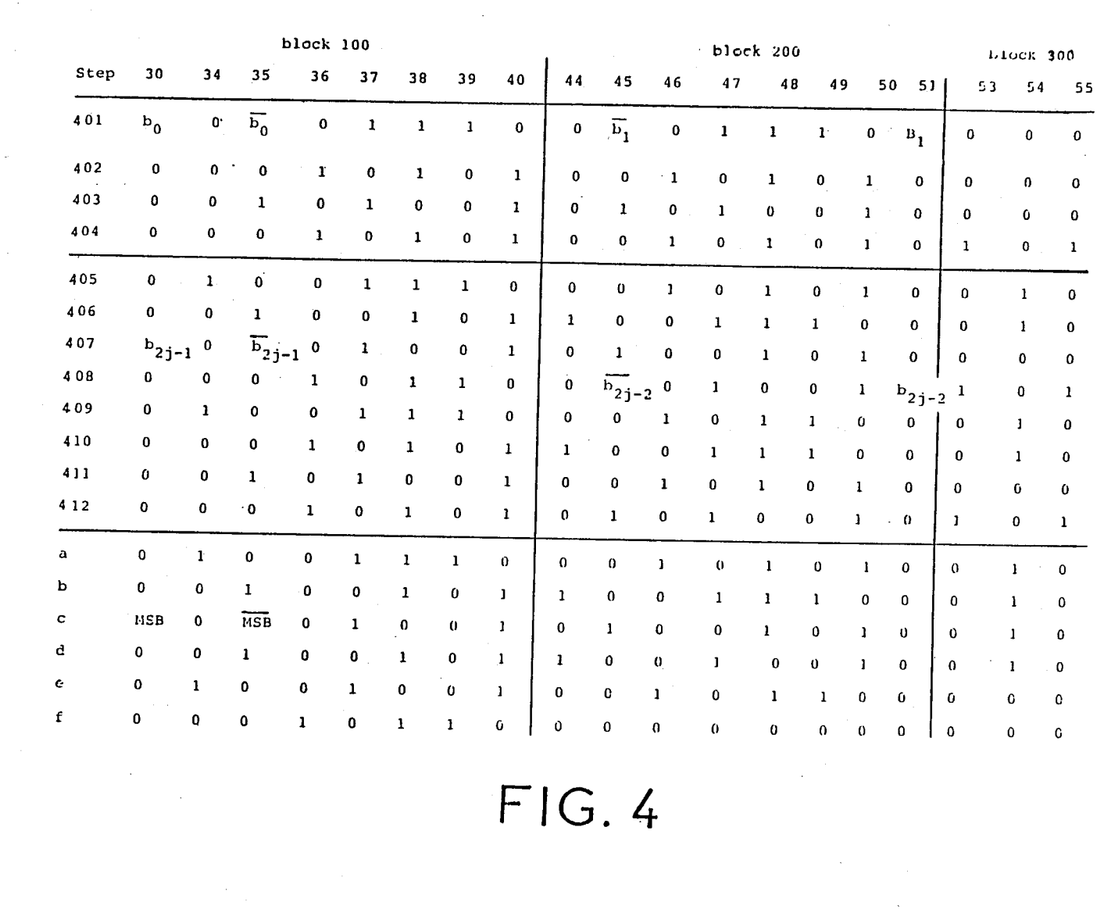
FIG. 4 is a progress chart according to the flow chart of FIGS. 2a and 2b, FIGS. 5a, 5b, 5c and 5d illustrate circuit elements shown in FIG. 3 during different phases.

FIG. 4 is a progress chart, according to the flow chart of FIGS. 2a and 2b which details the different steps of a conversion cycle. This chart describes, step by step, the state of each switch. The number of N bits of the word is assumed to be even.

Step 401 to 404 initiate the conversion process by treating the first two bits $b_0$ and $b_1$.

In step 401, switches 34, 36, 40, 44, 46, 50, 53, 54, and 55 are OFF (state 0). The state of switches 30 and 35 depends on the value of the first bit $b_0$, the Boolean expressions are:

state of switch 30=$b_0$, and
state of switch 35=$\bar{b}_0$.

Likewise, the state of switches 45 and 51 depends on the value of the second bit $b_1$, the Boolean expressions are:

state of switch 45=$\bar{b}_1$, and
state of switch 51=$b_1$.

The other switches are ON (state 1). This step permits the processing of the first two bits and begins the division by 4 of $b_0\times V_{ref}$ in block 100 and the division by 4 of $b_1\times V_{ref}$ in block 200.

In step 402, switches 30, 34, 35, 37, 39, 44, 45, 47, 49, 51, 53, 54, and 55 are OFF (state 0) and the other switches are ON (state 1).

In step 403, switches 30, 34, 36, 38, 39, 44, 46, 48, 49, 51, 53, 54, and 55 are OFF (state 0) and the other switches are ON (state 1).

In step 404, switches 30, 34, 35, 37, 39, 44, 45, 47, 49, 51 and 54 are OFF (state 0) and the other switches are ON (state 1). This step permits the transfer of $b_0\times V_{ref}/4$ from block 100 to the sample/hold block 300, and ends the division by 4.

Steps 405 to 412 make up an elementary processing cycle which allows the conversion of two following bits $b_{2j-2}$ and $b_{2j-1}$ (j=2 to 5), according to step 114 and 115 of FIG. 2a.

In step 405, switches 30, 35, 36, 40, 44, 45, 47, 49, 51, 53 and 55 are OFF (state 0) and the other switches are ON (state 1). This step allows the transfer of the voltage $V_i$ from block 200 to the block 100.

In step 406, switches 30, 34, 36, 37, 39, 45, 46, 50, 51, 53 and 55 are OFF (state 0) and the other switches are ON (state 1). This step allows the transfer of the voltage $V_p$ from block 300 to block 200.

In step 407, switches 34, 36, 38, 39, 44, 46, 47, 49, 51, 53, 54 and 55 are OFF (state 0). The state of switches 30 and 35 depends on the value of bit $b_{2j-1}$, the Boolean expressions are:

state of switch 30=$b_{2j-1}$,
state of switch 35=$\bar{b}_{2j-1}$, and the other switches are ON (state 1). This step allows the addition of $b_{2j-1}\times V_{ref}$ with the voltage $V_i$ which has been injected, step 5, in block 100.

In step 408, switches 30, 34, 35, 37, 40, 44, 46, 48, 49 and 54 are OFF (state 0). The state of switches 45 and 51 depends on the value of bit $b_{2j-2}$, the Boolean expressions are:

state of switch 45=$\bar{b}_{2j-2}$,
state of switch 51=$b_{2j-2}$, and the other switches are ON (state 1). This step allows the addition of $b_{2j-2}\times V_{ref}$ with the voltage $V_p$ which has been injected, step 6, in block 200. This step also permits transfers of the voltage $(V_i+b_{2j-1}\times V_{ref})$ from block 100 into the block 300.

In step 409, switches 30, 35, 36, 40, 44, 45, 47, 50, 51, 53 and 55 are OFF (state 0) and the other switches are ON (state 1). This step ends the addition process in block 200 and transfers the voltage $(V_p+b_{2j-2}\times V_{ref})$ from block 200 into the block 100 to begin a new division by 4 cycle.

In step 410, switches 30, 34, 35, 37, 39, 45, 46, 50, 51, 53 and 55 are OFF (state 0) and the other switches are ON (state 1). This step carries out the transfer of $(V_i+b_{2j-1}\times V_{ref})$ from block 300 into block 200 to begin a division by 4 cycle. This step is also the second phase of the division by 4 of the voltage $(V_p+b_{2j-2}\times V_{ref})$ in block 200.

In step 411, switches 30, 34, 36, 38, 39, 44, 45, 47, 49, 51, 53, 54 and 55 are OFF (state 0) and the other switches are ON (state 1). This step is the second phase of the division by 4 of $(V_i+b_{2j-1}\times V_{ref})$ in block 200 and the third phase of the division by 4 of the voltage $(V_p+b_{2j-2}\times V_{ref})$ in block 100.

In step 412, switches 30, 34, 35, 37, 39, 44, 46, 48, 49, 51 and 54 are OFF (state 0) and the other switches are ON (state 1). This step is the end of the division by 4 in the block 100 and the transfer of the voltage $(V_p+b_{2j-2}\times V_{ref})$ from block 100 into 300. This step is also the third phase of the division by 4 of $(V_i+b_{2j-1}\times V_{ref})$ in block 200.

Then the counter j is incremented and steps 5 to 12 are repeated till j=6 (the last bits to be converted are the MSB and the sign bit). When j=6 the sequence progresses to step a.

In step a, switches 30, 35, 36, 40, 44, 45, 47, 49, 51, 53 and 55 are OFF (state 0) and the other switches are ON (state 1).

This step is the holding of $V_i$ in the block 300 and the transfer of $V_p$ in block 100 (first phase of an addition).

In step b, switches 30, 34, 36, 37, 39, 45, 46, 50, 51, 53 and 55 are OFF (state 0) and the other switches are ON (state 1). This step is the beginning of a multiplication by 2 in the block 200 and the second phase of the addition in block 100.

In step c, switches 34, 36, 38, 39, 44, 46, 47, 49, 51, 53 and 55 are OFF (state 0). The state of switches 30 and 35 depends on the value of the bit MSB, the Boolean expressions are:
state of switch 30=MSB,
state of switch 35=$\overline{MSB}$, and
the other switches are ON (state 1). This step allows the addition of the voltage corresponding to the MSB in block 100 and produces the second phase of the multiplication by 2 in block 100.

In step d, switches 30, 34, 36, 37, 39, 45, 46, 48, 49, 51, 53 and 55 are OFF (state 0) and the other switches are ON (state 1). This step is the third phase of the multiplication by 2 in block 200 and the end of the addition of the MSB into the block 100.

In step e, switches 30, 35, 36, 38, 39, 44, 45, 47, 50, 51, 53, 54 and 55 are OFF (state 0) and the other switches are ON (state 1). This step is the end of the multiplication by 2 of the odd values and the addition of that result to even values in block 100.

In step f, switches 30, 34, 35, 37, 40, 44, 45, 46, 47, 48, 49, 50, 51, 53, 54 and 55 are OFF (state 0) and the other switches are ON (state 1). This step is the output of the final value $2\times V_p+V_i$.

The sign bit is taken into account simply by replacing each addition by a subtraction. This takes one more clock cycle for each bit because a substraction needs one more clock cycle than an addition.

FIGS. 5a, 5b, 5c and 5d detail the process which permits the block 100 (and 200) to operate a precise multiplication by 2. This operation is also described in the literature (1984 IEEE-ISSCC Wednesday, Feb. 22, 1984).

The block 100 includes an operational amplifier (OA) 31 (FIG. 3) which has its first input connected to ground and its second input connected to a first terminal of swtiches 37, 38, and capacitor 32. The second terminal of capacitor 32 is connected to a first terminal of switches 30, 34, 35 and 36. The second terminals of switches 30, 34, 35 and 36 are connected, respectively, to bias voltage $V_{ref}$, the output of the OA 41, ground and the output of the OA 31. The second terminals of switches 37 and 38 are connected, respectively, to the output of the OA 31 and to a first terminal of capacitor 33, with the second terminal of capacitor 33 being connected to the first terminal of switches 39 and 40. The second terminals of switches 40 and 39 are connected, respectively, to the output of the OA 31 and ground.

Let us make the following assumptions:
the OA 31 has an offset called off, and
C32 and C33 are the numerical value of the capacitors 32 and 33 different only by the mismatching between the two capacitors.

The following relation can be written:
C33=(1+E)·C32, wherein E is the coefficient representative of the mismatching of the two capacitors, and
$V_{out}$ is the output voltage of the OA 31.

When switches the 34, 37, 38 and 39 are ON, and the other switches are OFF, the schematic of block 100 in FIG. 3 is equivalent to the schematic of FIG. 5a. This step realizes a first sampling of the input voltage and an offset cancel.

Indeed, capacitor 32 is first charged to the input voltage minus the OA 31 offset, while capacitor 33 is charged to the OA 31 offset.

When switches 35, 38 and 40 are ON, and the other ones are OFF, the schematic of block 100 is equivalent to the schematic of FIG. 5b. The feedback loop is opened, capacitor 33 is connected to the OA 31 output, and capacitor 32 is disconnected from the source $V_{in}$ and connected to the ground, with C32 being discharged and its charge being transferred to C33.

When switches 34, 37 and 40 are ON, and the other ones are OFF, the schematic block 100 is equivalent to the schematic of FIG. 5c. Capacitor 33 is disconnected from the summing node to maintain the previous charge in it and the input is resampled again with capacitor 32.

When switches 36, 38 and 39 are ON, and the other ones are OFF, the schematic of block 100 is equivalent to the schematic of FIG. 5d. The charge on the capacitor 33 is dumped again on capacitor 32 in addition to the charge which has just been sampled in FIG. 5c.

This provides an output which is twice the input voltage, independent of the ratio of the capacitors (at the second order relative to the unmatching of the capacitors). The sequence requires 4 clock steps to complete.

Block 200 is similar to block 100.

A characteristic of this embodiment of the invention is that the block 100 (and 200) is used again to provide an accurate division by 4 process. However, the states of the switches in the steps of a division cycle are different than previously.

FIGS. 6a, 6b, 6c and 6d describe the 4 steps which provide the division by 4 process.

When switches 34, 37, 38 and 39 are ON, and the other switches are OFF, the block 100 of FIGS. 3 is equivalent to the schematic of FIG. 6a. This step realizes as before, a first sampling of the input voltage and an offset cancel.

When switches 36, 38 and 40 are ON, and the other switches are OFF, the block 100 is equivalent to the schematic of FIG. 6b. This step realizes a redistribution of charge from capacitor 32 to capacitor 33. The output voltage is:

$$V_{out} = V_{in}/(2+E).$$

When switches 35, 37 and 40 are ON, and the other switches are OFF, the block 100 is equivalent to the schematic of FIG. 6c. This step realizes a holding of previous charge in capacitor 33 and a discharge of capacitor 32.

When switches 36, 38 and 40 are ON, and the other switches are OFF, the block 100 is equivalent to the schematic of FIG. 6d. This step realizes a second transfer of charge from capacitor 33 to capacitor 32. The output voltage is then:

$$V_{out} = (V_{in}/4) \times \frac{(1 + E)}{(1 + E/2)^2}.$$

The expansion in TAYLOR's series of $$\frac{(1 + E)}{(1 + E/2)^2}$$

shows that this function is of a second order relative to E.

In conclusion, the input voltage has been divided accurately by 4 (at the second order relative to E), without any error introduced by the mismatching of the capacitors. The offset of the operational amplifier is cancelled during the cycle.

Figure 7:
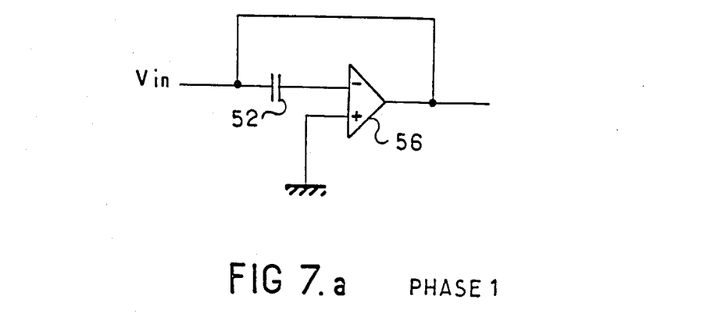
FIGS. 7a and 7b illustrate circuit elements shown in FIG. 3 for sample-hold operation.

FIGS. 7a and 7b illustrate the well known process which permits block 300 to operate a sample-hold function, e.g., taking an input signal and then holding its instantaneous value.

The block 300 includes an operational amplifier 56 (FIG. 3) which has its first input connected to ground and its second input connected to a first terminal of switch 53 and capacitor 52. The second terminal of capacitor 52 is connected to a first terminal of switch 55 and of switch 54. The second terminal of switch 55 and of switch 54 are connected, respectively, to the output of the OA 31 and the output of the OA 56. The second terminal of switch 53 is connected to the output of the OA 56 and the terminal of switch 44.

When switches 54 and 55 are ON (state 1) and switch 53 is OFF (state 0), block 300 is equivalent to the schematic of FIG. 7a. This step provides a first sampling of the input voltage $V_{in}$.

When switches 53 and 55 are OFF (state 0) and switch 54 is ON (state 1), block 300 is equivalent to the schematic of FIG. 7b. This step holds the instantaneous value of $V_{in}$ which has been sampled in FIG. 7a.

It should be noticed that the circuit described herein may be advantageously implemented with full differential operational amplifiers, having each two inputs and two outputs. Indeed such a structure would increase the signal/noise ratio and would permit processing sign step 220 of FIG. 2b more easily. That implementation is obvious for those skilled in the art.

While the invention has been particularly shown and described with reference to preferred embodiments thereof, it will be understood by those skilled in the art that various changes in form and details may be made therein without departing from the spirit and scope of the invention.

What is claimed is:

1. A digital to analog converter for converting an N bit digital word into its analog representation, characterized in that it includes:
    means for splitting the N bit word and creating n sections (n≠1 and n≠N) of N/n bits each,
    means for processing each section independently, including means for changing each elementary bit of a section into its analog representation and means for combining arithmetically the different analog representations relating to a section to obtain a section partial result and for storing the result of the arithmetic combination and,
    means for adding the various section partial results to provide the analog representation of said N bit word.

2. A digital to analog converter as set forth in claim 1 including a voltage source $V_{ref}$ and in which the analog representations of an elementary bit is a voltage equal to $V_{ref}$ or 0 volt, characterized in that,
    said means for combining arithmetically the different analog representations further includes a voltage register to store intermediate results of the arithmetic combination of the said arithmetic combination $V_{ref}$ or 0 volt,
    said means for combining arithmetically the different analog representations further includes a means for multiplying the contents of the said voltage register by a given coefficient which depends upon the number of sections, and thus taking into account the different weights of each bit in the calculation of the section partial result, and
    said means for combining arithmetically the different analog representations further includes a means for adding the contents of said voltage register with said analog representation $V_{ref}$ or 0 volt to take into account in the calculation of the section partial result, each bit of the said section.

3. A digital to analog converter as set forth in claim 2, characterized in that:
    the number of sections is two, the N bits being split into odd bits and even bits, and
    said means for multiplying the contents of the said voltage register by a given coefficient includes a multiply by 2 circuit and a divide by 4 circuit.

4. A digital to analog converter for converting an N bit digital word into its analog representation, characterized in that it includes:
    means for splitting the N bit word and creating n sections (n≠1 and n≠N) of N/n bits each,
    means for processing each section independently, including means for changing each elementary bit of a section into its analog representation and means for combining arithmetically the different analog representations relating to a section to obtain a section partial result, means for adding the various section partial results to provide the analog representation of said N bit word, and a voltage source $V_{ref}$, said analog representations of an elementary bit being a voltage equal to $V_{ref}$ or 0 volt, said means for combining arithmetically the different analog representations further including a voltage register to store intermediate results of the arithmetic combination of said arithmetic combination $V_{ref}$ or 0 volt, said means for combining arithmetically the different analog representations further including a means for multiplying the contents of said voltage register by a given coefficient which depends upon the number of sections, and thus taking into account the different weights of each bit in the calculation of the section partial result, said means for combining arithmetically the different analog representations further including a means for adding the contents of said voltage register with said analog representation $V_{ref}$ or 0 volt to take into account in the calculation of the section partial result, each bit of the said section, said number of sections being two, the N bits being split into odd bits and even bits, said means for multiplying the contents of said voltage register by a given coefficient includes a multiply by 2 circuit and a divide by 4 circuit, said multiply by 2 circuit including an operational amplifier, a first capacitor, a second capacitor, and a set of switches, said switches commuting between OFF and ON in steps in progress to remove electrical charges from said first capacitor to said second capacitor to permit an accurate multiply by 2 process independently from the mismatch of said capacitors, said divide by 4 circuit including said amplifier, said capacitors, and said set of switches, said switches commuting between OFF and ON to provide a first sampling in said first capacitor, then a redistribution of charge from said first capacitor to said second capacitor, then a holding of charge in said second capacitor while discharging said first capacitor, then a second transfer of charge from said second capacitor to said first capacitor and hence providing an accurate division by 4 process, and said means for adding the various section partial results and said means for adding the contents of the said voltage register with said analog representation $V_{ref}$ or 0 volt including said amplifier, said capacitors and said set of switches, said switches commuting between OFF and ON to process an addition of charge in the second capacitor and then to provide an accurate addition process.

* * * * *